United States Patent [19]

Soth

[11] Patent Number: 4,581,809

[45] Date of Patent: Apr. 15, 1986

[54] DEVICE FOR HAIRPIN-TYPE FORMING OF AXIAL LEAD COMPONENTS

[75] Inventor: Henry J. Soth, Brackney, Pa.

[73] Assignee: Universal Instruments Corporation, Binghamton, N.Y.

[21] Appl. No.: 545,857

[22] Filed: Oct. 27, 1983

[51] Int. Cl.⁴ .............................................. H05K 3/30
[52] U.S. Cl. .................. 29/566.3; 29/33 M; 140/105; 83/411 R; 83/435.2
[58] Field of Search ............... 29/566, 566.1, 566.2, 29/566.3, 882, 884, 33 F, 33 M; 140/105, 102; 83/411 R, 435.2

[56] References Cited

U.S. PATENT DOCUMENTS

| | | | |
|---|---|---|---|
| 2,592,019 | 4/1952 | Farnett | 83/411 R |
| 2,929,289 | 3/1960 | Gorecki | 83/411 R |
| 3,149,340 | 9/1964 | Gagnon | 72/394 |
| 3,540,494 | 11/1970 | Susong | 72/384 |
| 3,907,008 | 9/1975 | Bates et al. | 29/566.3 |
| 3,945,100 | 3/1976 | Whiting et al. | 29/748 |
| 4,205,433 | 6/1980 | Araki et al. | 29/566.2 |
| 4,249,581 | 2/1981 | Weresch | 140/105 |
| 4,403,723 | 9/1983 | Dean et al. | 227/119 |
| 4,507,862 | 4/1985 | Kukowski et al. | 227/115 |

Primary Examiner—Gil Weidenfeld
Assistant Examiner—Daniel W. Howell
Attorney, Agent, or Firm—Fidelman, Wolffe & Waldron

[57] ABSTRACT

Under the direction of a controller, taped axial lead components are sequentially advanced to a forming area at which the components are severed from the taped ends of their leads, formed into a hairpin-type configuration, and positively driven into engagement with conveyor-mounted carrier clips for subsequent handling by radial lead apparatus.

8 Claims, 27 Drawing Figures

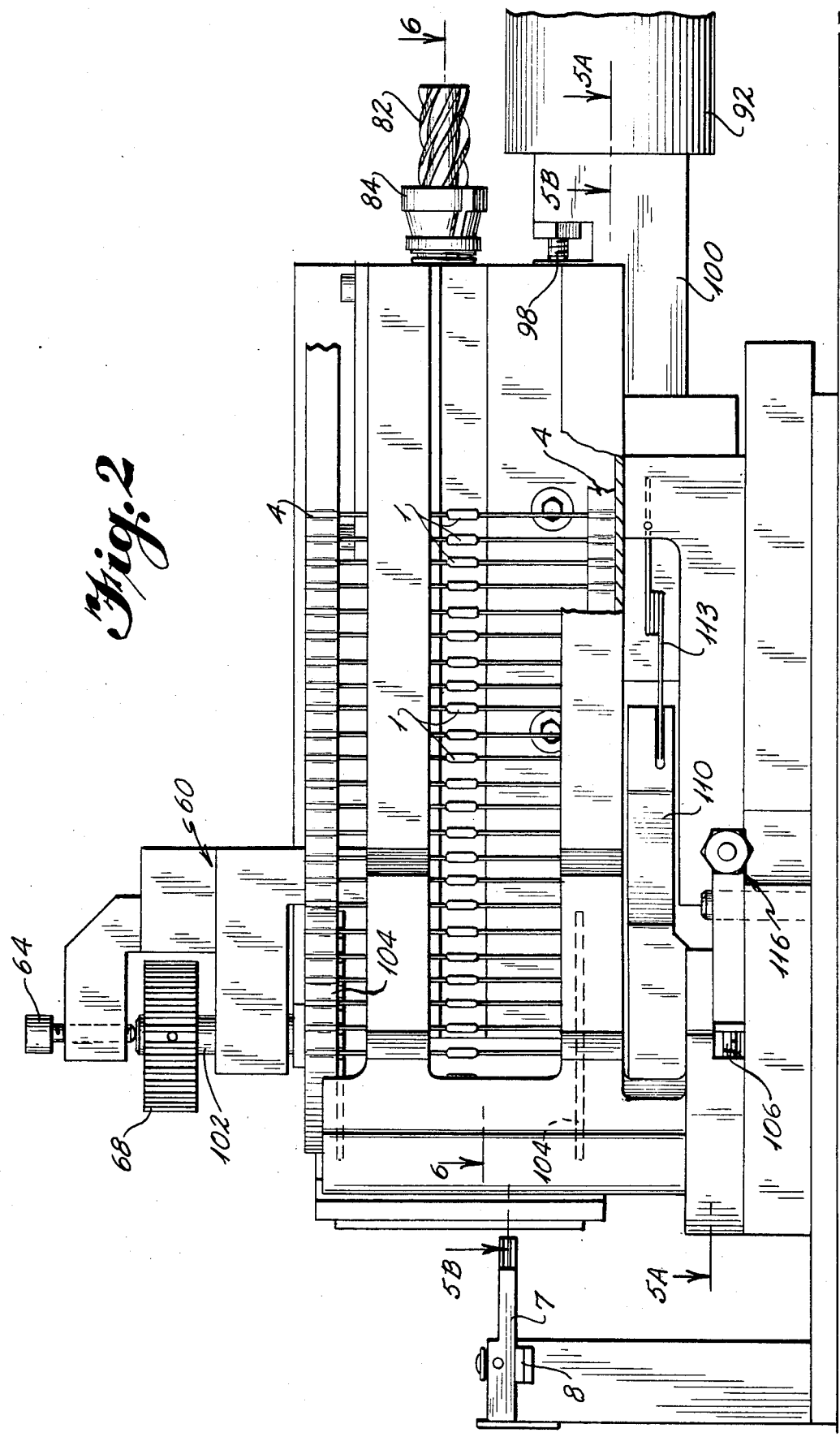

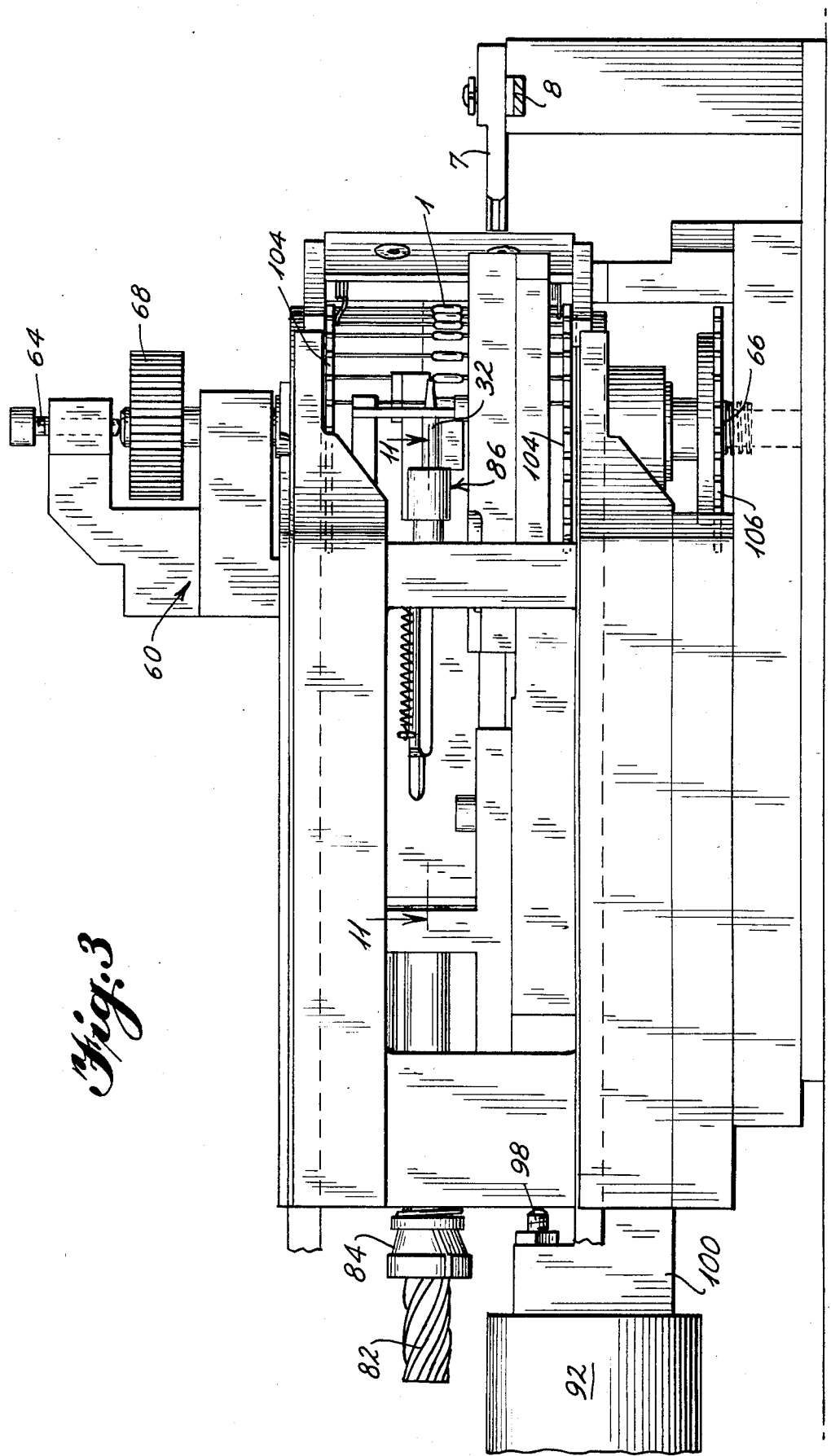

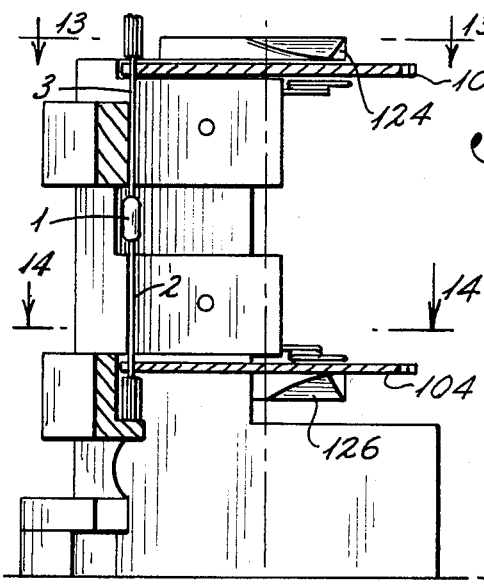
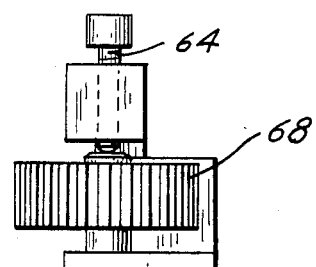
Fig.16
Fig.4
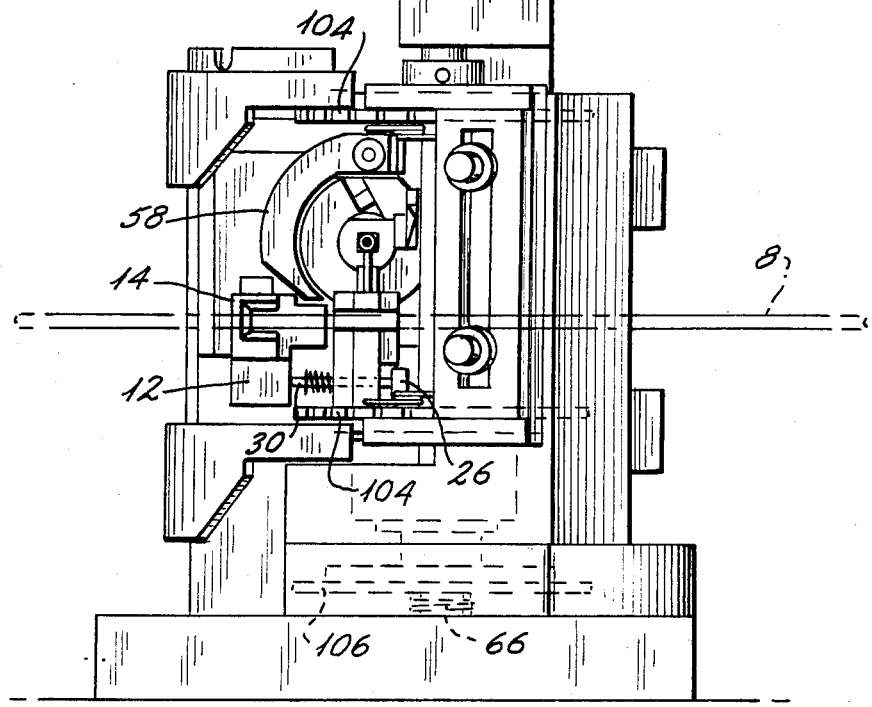
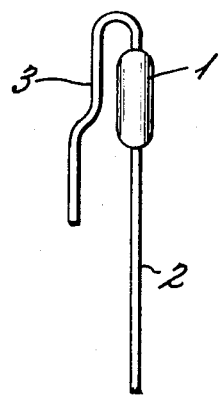
Fig.26

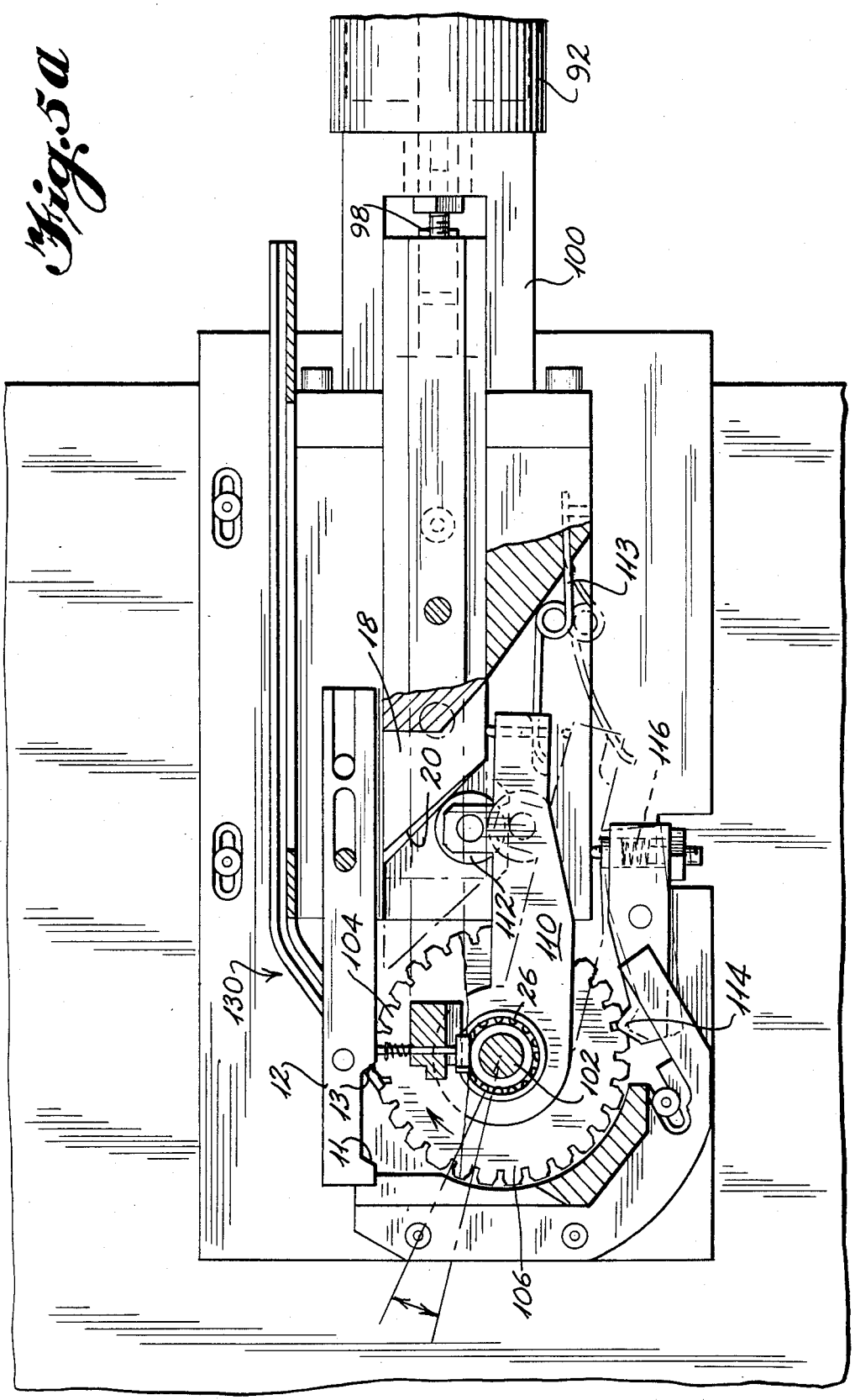

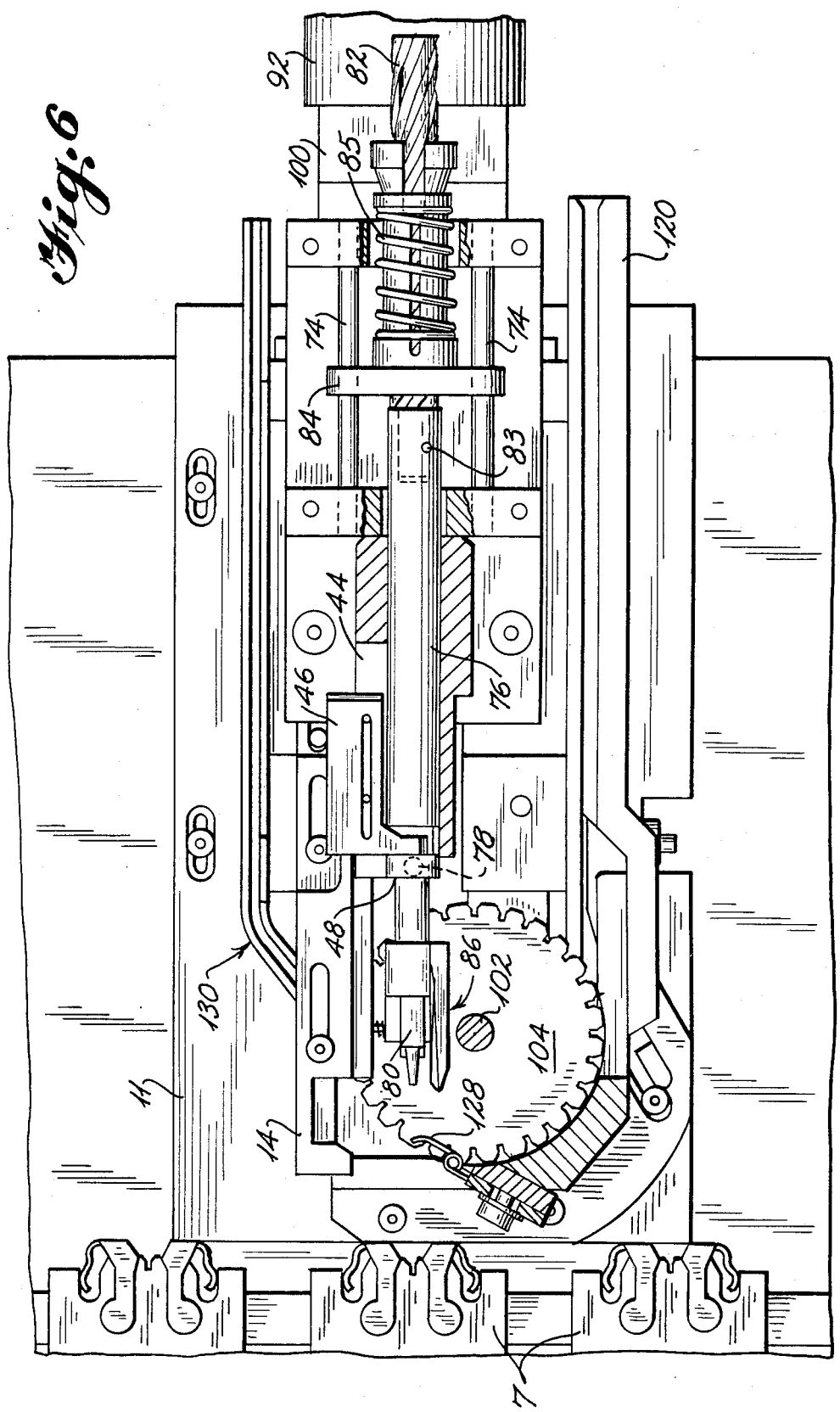

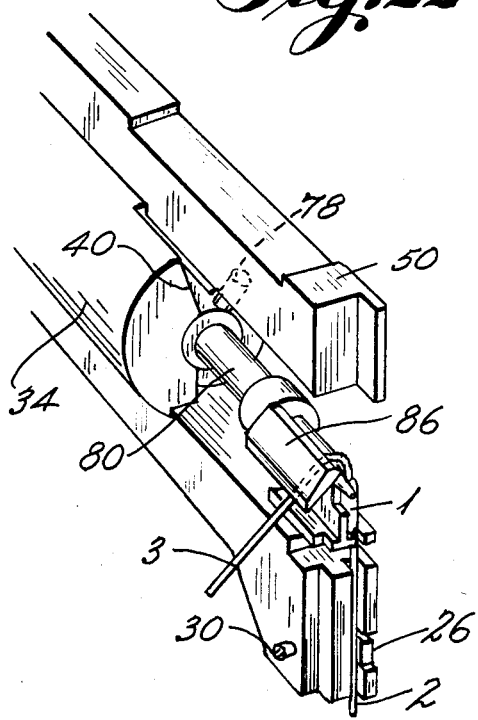
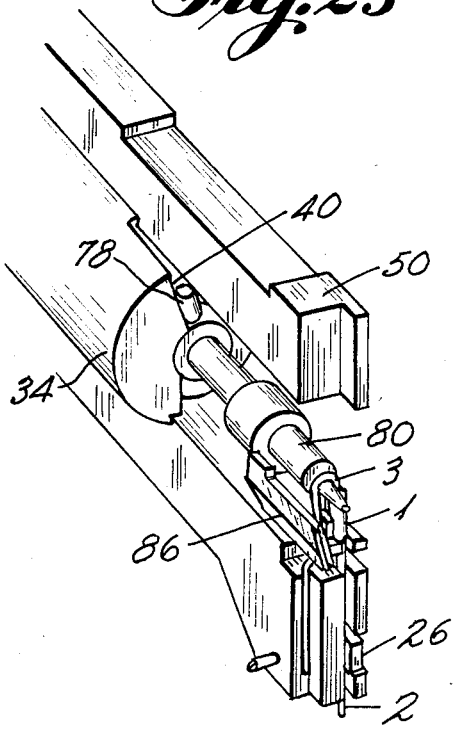
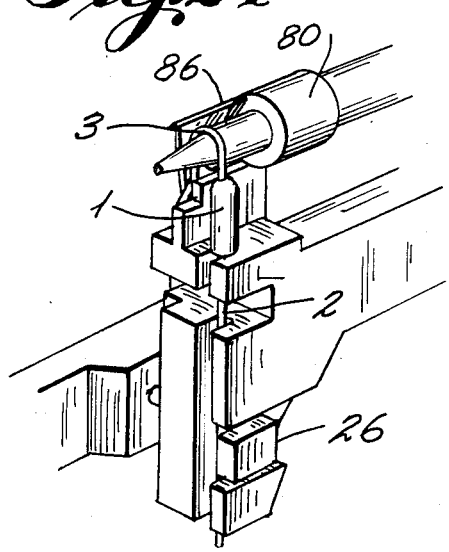
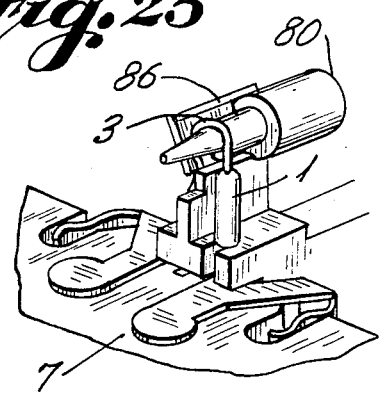

DEVICE FOR HAIRPIN-TYPE FORMING OF AXIAL LEAD COMPONENTS

CROSS REFERENCES TO THE PRIOR ART

U.S. Pat. No. 3,907,008—"INSERTION APPARATUS"—Bates, et al, issued Sept. 23, 1975.

U.S. Pat. No. 3,945,100—"AXIAL LEAD COMPONENT PREFORMING AND INSERTION APPARATUS"—Whiting, et al, issued Mar. 23, 1976.

U.S. Pat. No. 3,540,494—"MACHINE FOR TREATING ELECTRICAL COMPONENTS"—Susong, issued Nov. 17, 1970.

U.S. Pat. No. 3,149,340—"STAND UP INSERTION HEADS"—Gagnon, issued Sept. 22, 1964.

U.S. Pat. No. 4,403,723—"SEQUENCER LOADING HEAD FOR HIGH SPEED RADIAL LEAD COMPONENT SEQUENCING AND INSERTING MACHINE"—Dean, et al, issued Sept. 13, 1983.

U.S. Application Ser. No. 470,727—"METHOD AND APPARATUS FOR HIGH SPEED TRANSFER AND INSERTION OF ELECTRICAL COMPONENTS"—Kukowski, et al, filed Feb. 28, 1983, now U.S. Pat. No. 4,507,862, issued Apr. 2, 1985.

BACKGROUND AND SUMMARY OF THE INVENTION

The invention relates to an apparatus for indexing and forming axial lead components into hairpin-type configurations and loading of the formed components into component carrying clips of a conveyor system.

The apparatus of the invention automatically indexes a supply of taped together axial lead electrical components, in the form in which they are usually shipped, and forms them into a hairpin-type configuration such that they are easily manipulatable by radial lead component handling apparatus.

It is an object of the invention to provide such an apparatus in which complete handling of the component during incremental feeding, forming, and loading of a conveyor, is accomplished by a high speed automated device which only handles the components by the lead portions, as opposed to the body portions, thereof.

It is a further object of the invention to provide such a device which is adaptable to existing high speed machinery for handling radial lead electronic components.

It is an additional object of this invention to obviate the cost of and need for axial lead components which have been preformed into a hairpin-type configuration prior to attachment to feed tapes.

These and other objects of the invention will become apparent from the remaining disclosure.

A preferred embodiment of the invention provides a reciprocating tooling assembly which sequentially addresses and handles components presented to a forming area by indexed feed wheels. During indexing of the feed wheels, the taped ends of the axial lead components are severed therefrom. The reciprocating tooling assembly grips one lead of a component, while bending and forming the other lead to accomplish a hairpin-type configuration of the component. The formed component is then transferred in a direction perpendicular to a plane defined by the leads of the formed component, in order to positively engage the leads thereof with a carrier clip of a conveyor for subsequent transferring of the formed component to an apparatus for processing radial lead-type components.

Advantages of the instant invention include; forming the lead which is not under the body of the component during the insertion thereof such that the overall height of an inserted component is reduced; allowing insertion of axial lead components by radial lead systems; reducing costs by obviating the need for purchasing taped components which have already been formed into a hairpin-type configuration while, for the same length of tape, being able to handle more components than with preformed components; and allowing presequencing of different valued axial lead components onto a taped reel such that a single device of the instant invention may be used to feed all of the needed axial lead components into a high speed radial lead transfer and insertion system.

BRIEF DESCRIPTION OF THE DRAWINGS

FIG. 2 is a right side elevation of the device of FIG. 1.

FIG. 3 is a left side elevation of the device of FIG. 1.

FIG. 4 is a front elevation of the device of FIG. 1.

FIG. 5A is a partial cross-section, as viewed generally in the direction of arrows 5A—5A of FIG. 2.

FIG. 6 is a cross-section as viewed generally in the direction of arrows 6—6 of FIG. 2.

FIG. 16 is a cross-section, as viewed generally in the direction of arrows 16—16 of FIG. 1.

FIGS. 18-25 are partial isometric views illustrating indexing of a component to the forming area, forming the component, and unloading the component from the rotary former onto the clip of a conveyor.

FIG. 26 is a front elevation of a typical axial lead component after forming by the device of the instant invention.

DETAILED DESCRIPTION OF THE INVENTION

Figure 9:
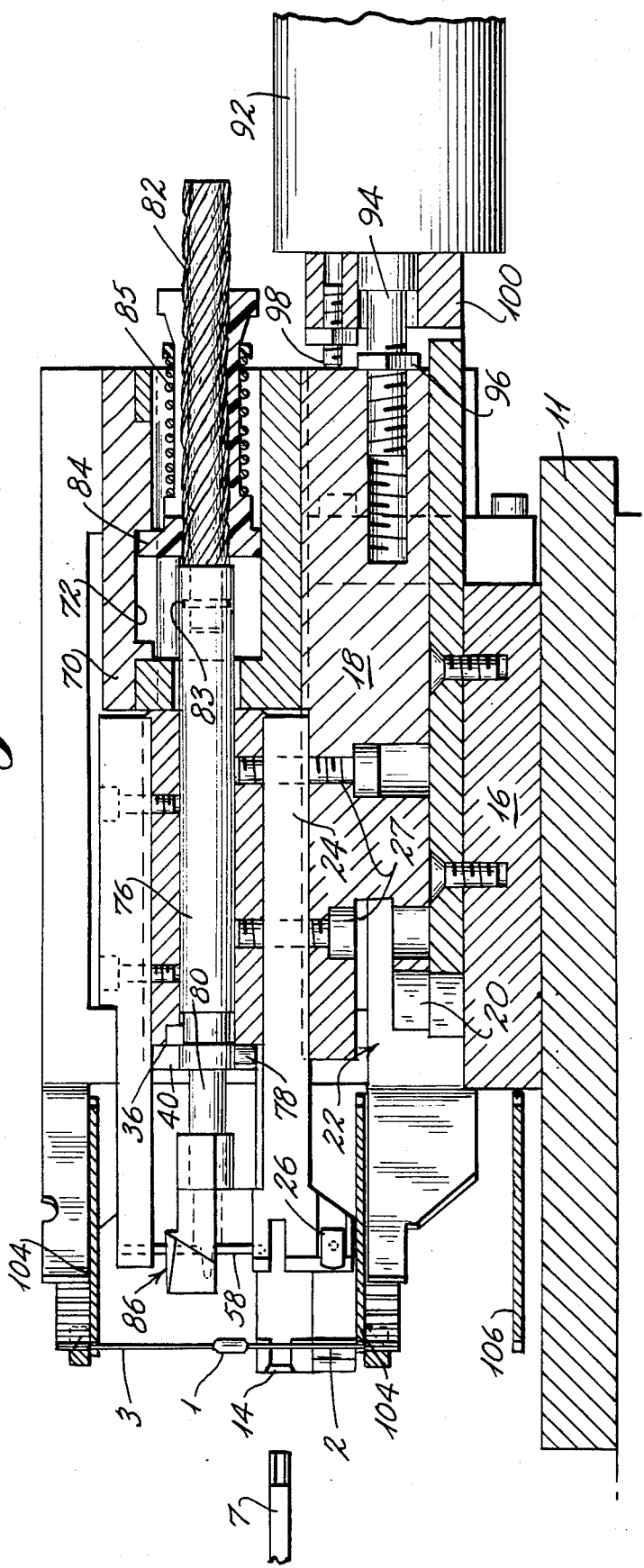
FIG. 9 is a cross-section, as viewed generally in the direction of arrows 9—9 of FIG. 1.
Figure 17:
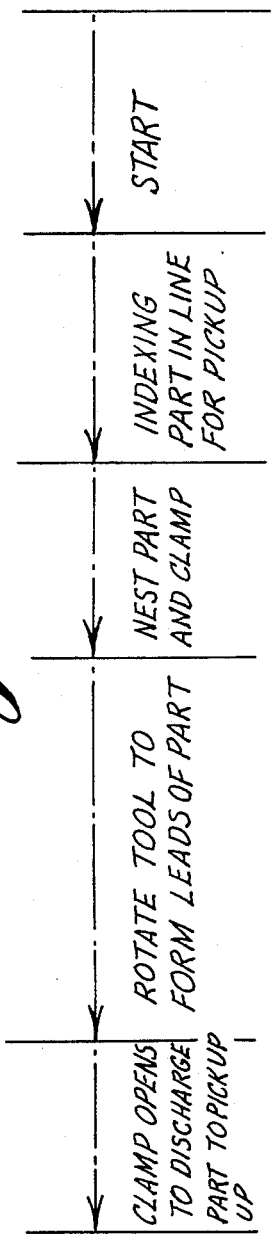
FIG. 17 is a chart illustrating a general sequence of operation.

With reference to the drawings, a generally U-shaped housing 10 is bolted to a base plate 11. Slide member 18 is reciprocatable within the U-shaped channel of housing 10, with plate 16 screwed to the bottom of the channel in order to afford a support and bearing surface for slide member 18. Bracket 100 is bolted to the rear of U-shaped housing 10 for support of actuating cylinder 92. As seen in FIG. 9, piston 94 of the actuator 92 is threaded into slide 18, with a nut 96 cooperating with the threads of piston 94 in order to provide an adjustment for the stroking of slide 18 relative to housing 10. Screw 98 is threaded into bracket 100 to adjusably engage and limit the extent of return stroke of slide 18.

Figure 8:
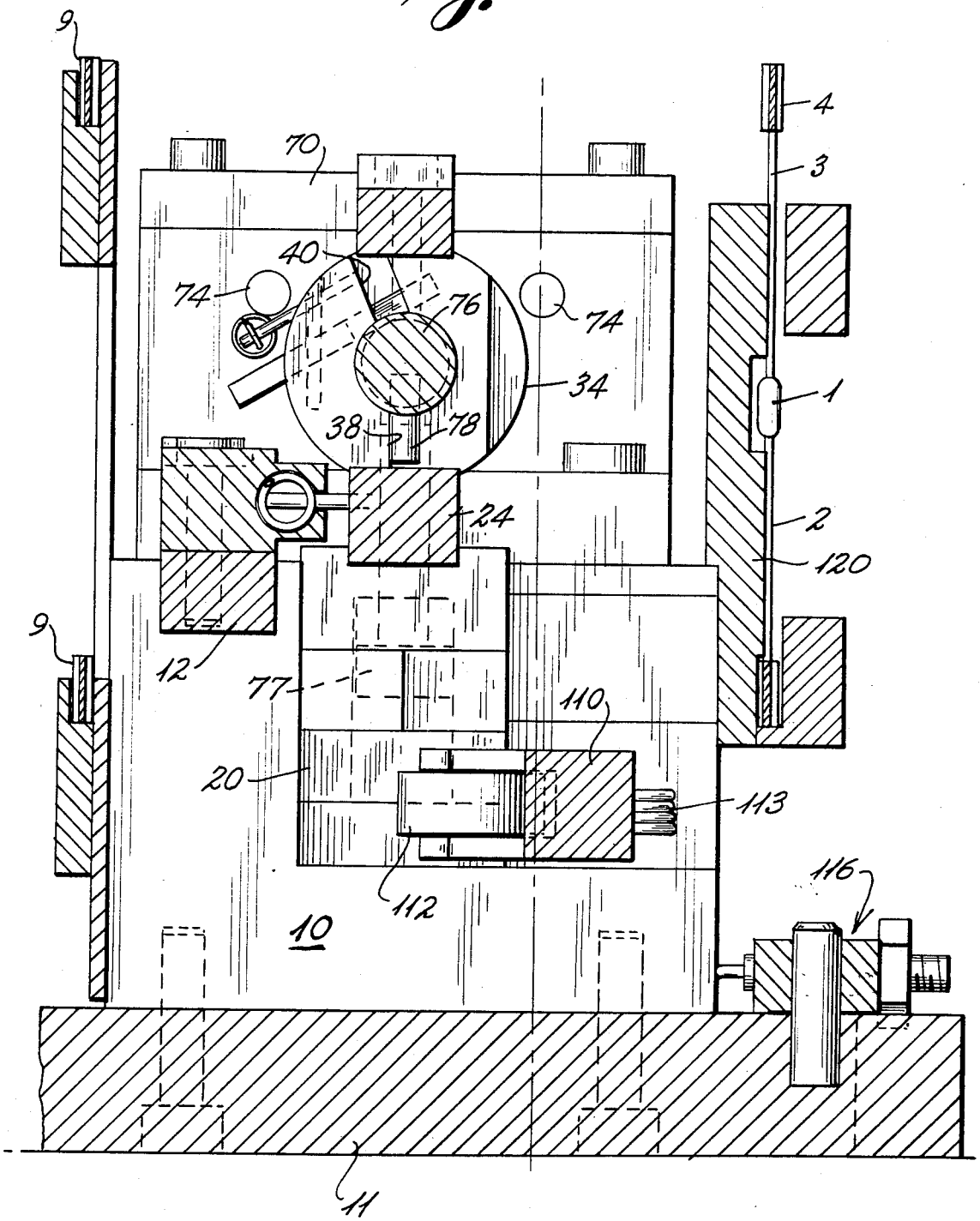
FIG. 8 is an enlarged cross-section, as viewed generally in the direction of arrows 8—8 of FIG. 1.
Figure 10:
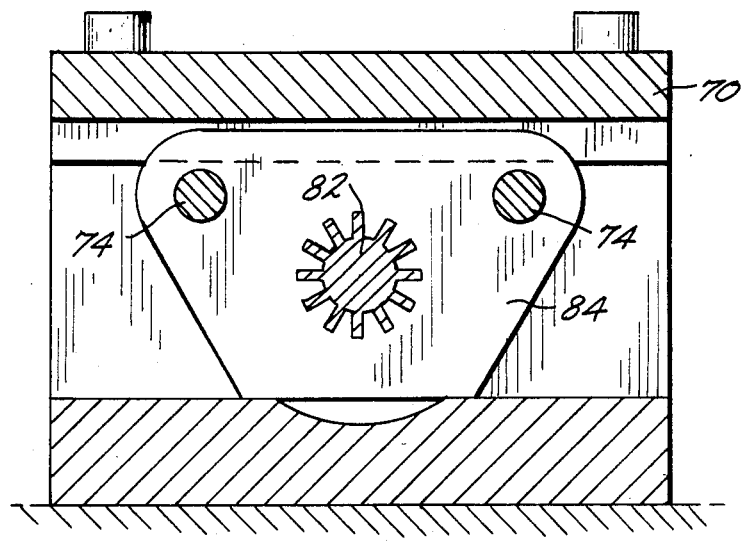
FIG. 10 is a cross-section, as viewed generally in the direction of arrows 10—10 of FIG. 9.

As seen in FIGS. 8 and 9, reciprocating tooling bracket 24 and rotation limiter 34 are attached to the top of slide 18, by machine screws 77, for stroking in concert with slide 18. During the forward stroke (to the left as viewed in FIG. 9), rotary shaft 76 is carried forward with rotation limiter 34 via engagement of dog 78 of shaft 76 with a front face 36 of rotation limiter 34. A helix screw 82 is attached to, and coaxial with, rotary shaft 76 via a pin 83, and a split-ring helix nut 84 is retained in threaded engagement with helix 82 via spring 85. As seen in FIG. 9, a bracket 70 is provided with a slot 72 for limiting the forward and return movement of helix nut 84, with guide rods 74 (FIG. 10) preventing rotation of nut 84 relative to helix screw 82.

Shaft 76 is caused to rotate once helix nut 84 engages the left end (FIG. 9) of slot 72 after only a portion of the forward stroke of slide 18. Continued forward movement of slide 18 and shaft 76 causes rotation of helix 82 relative to nut 84 and, hence, rotation of shaft 76. The extent of rotation of shaft 76 is limited by two stops 38 and 40 at the front end of rotation limiter 34, as may be seen by reference to FIGS. 8, 11, 12, and 18–23. Stop 40 is engaged by dog 78 to halt counterclockwise (as viewed in FIG. 8) rotation of shaft 76 and stop 38 is engaged by dog 78 to halt clockwise rotation of shaft 76. Once dog 78 has engaged stop 40, further forward motion of rotation limiter 34 does not advance shaft 76, since notch 42 in rotation limiter 34 allows forward movement of rotation limiter 34 relative to dog 78 of shaft 76. The purpose of such relative movement will be described later with reference to transfer of a formed component from the device.

Forward stroking of slide 18 also causes indexed feeding of axial lead components 1, each attached by leads 2, 3, to feed tapes 4. During operation of the device, taped end portions 9 (seen at FIG. 8) are sequentially removed from remaining lead portions 2 and 3 of each component 1. Thereafter, one lead of each component is formed so as to achieve the configuration generally illustrated in FIG. 26, and a formed component is then transferred and loaded into a clip carrier 7 mounted on a conveyor chain 8.

Referring to FIGS. 1–9, an axle 102 is rotatably supported in base 11 and bracket 60 and has two feed wheels 104 and an index wheel 106 attached thereto. Notches in the periphery of each of feed wheels 104 receive leads 2, 3 of each component for feeding the taped components forward. Rotation of axle 102 to facilitate such feeding is provided by one-way clutch 108. Clutch 108 has a lateral arm 110, to which a cam follower roller 112 is attached. During forward stroking of slide 18, feeding of the taped components is facilitated by a cam surface 20 of slide 18 engaging cam follower roller 112 and pivoting clutch 108 clockwise (as viewed in FIG. 5A). This clockwise pivoting of clutch 108 provides driving engagement with axle 102; whereas, during the return stroke of slide 18, arm 110 is forced counterclockwise by spring 113 and clutch 108 acts only as a roller bearing.

Figure 13:
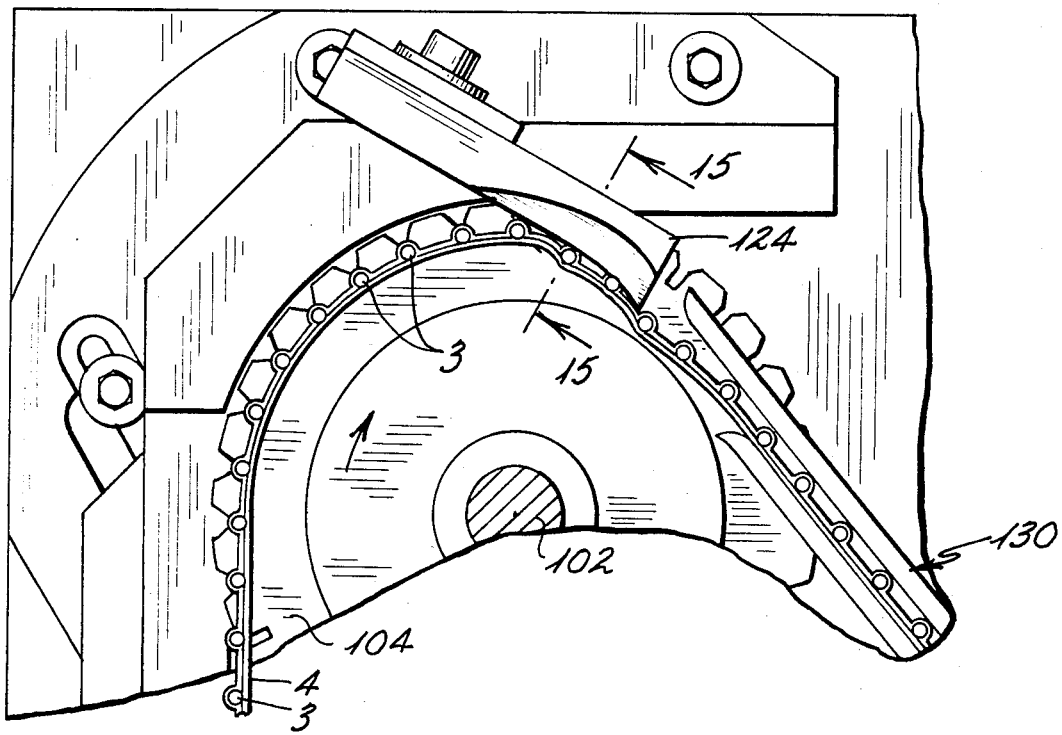
FIGS. 13 and 14 are enlarged, partial cross-sections, as viewed generally in the direction of arrows 13—13 and 14—14, respectively, of FIG. 16.
Figure 14:
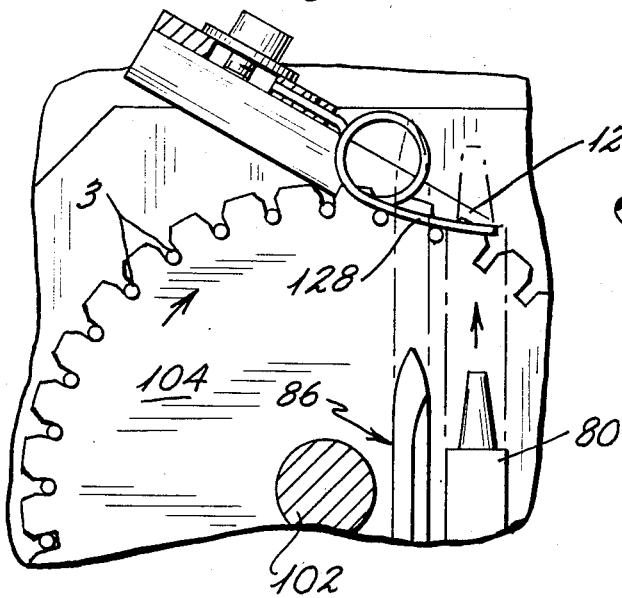
Figure 15:
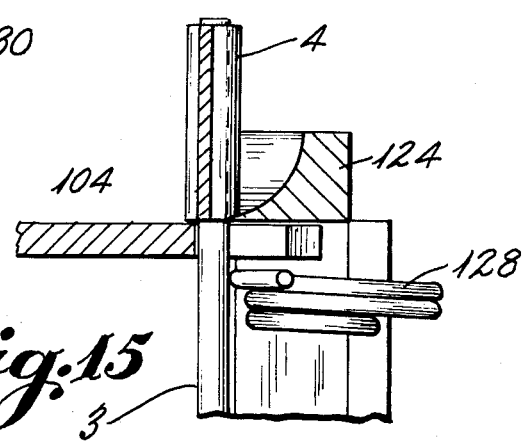
FIG. 15 is a cross-section, as viewed generally in the direction of arrows 15—15 of FIG. 13.

To ensure retention of the advanced position of axle 102, a pawl 114 engages with notches in the periphery of indexing wheel 106, with variable pressure for pawl 114 being provided by adjustable tension spring 116. As seen in FIG. 9, the front end of slide 18 has been notched at 22 in order to clear the bottom feed wheel 104 during forward stroking. Adjusting screws 64 and spring 66 (best seen in FIGS. 3, 4, and 7) allow vertical adjustment of the positioning of feed wheels 104 such that the taped components may be adjusted vertically for the subsequent forming operation. Knob 68 allows hand rotation of feed wheels 104 during set-up of the device. Guide 120 guides the taped components during feeding thereof to the forming area, whereas guide 130 guides the taped ends 9 away from the forming area upon severing thereof from the component. Referring to FIGS. 13–16, this severing is accomplished by upper and lower shear blades 124, 126 which are attached to a cutter block 122 which is, in turn, attached to entrance guide 120. The shear blades 124 actually force the lead tips 9 radially inward of the feed wheels, as seen in FIG. 13, to effect the shearing action during continued rotation of feed wheels 104. FIG. 13 illustrates cooperation of feed wheel 104 and blade 124 for the shearing action. Having severed the taped ends from the remaining portions of the leads, lead portions 2 and 3 are retained in engagement with the notches of the feed wheels 104 by retention springs 128, as best seen in FIGS. 14 and 15. These retention springs 128 hold the trimmed leads in the notches until they are forced out during the subsequent forming and loading operation.

Turning now to the forming operation, reciprocating tooling bracket 24 is provided with a clamp 26 for clamping bottom lead 2 of the component 1 after the taped ends have been severed from the component and while the leads 2 and 3 are still held within the notches of feed wheels 104 by retention springs 128. Lead clamp 26 has a cam follower rod 30 which telescopes through the side of reciprocating tooling bracket 24 for engagement with fixed cam 12. A spring 28 biases rod 30 toward cam 12 to close clamp 26. As seen in FIG. 5A, cam bar 12 has two camming surfaces 11, 13 such that when follower 30 is in engagement with that portion of bar 12 which is between cam surfaces 11 and 13, clamp 26 is in the closed position under the influence of spring 28; otherwise, clamp 26 is forced to the open position against the bias of spring 28. A clip loader is an integral, vertical extension of the front end of reciprocating tooling bracket 24, as best seen in FIGS. 18–25. Clip loader 32 is telescopic upon tip 80 of rotary shaft 76 and is provided at 33 with an anvil. Attached to tip 80, as by an Allen screw, is a rotary former member 86 having a bending face 88 and an offset forming portion 90 (FIG. 18) for cooperating with anvil 33. An arcuate guide 58 is supported upon arcuate guide bracket 56 which is attached by machine screws to rotational limiter 34.

Figure 18:
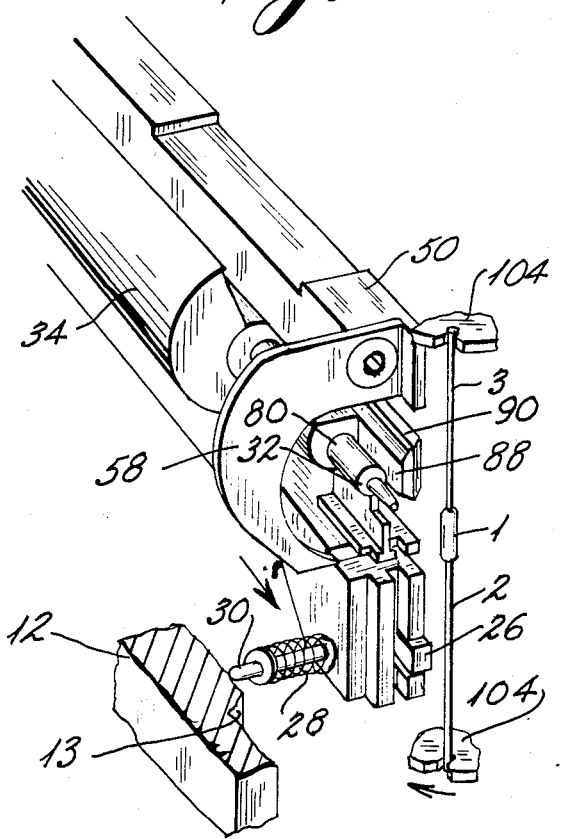
Figure 19:
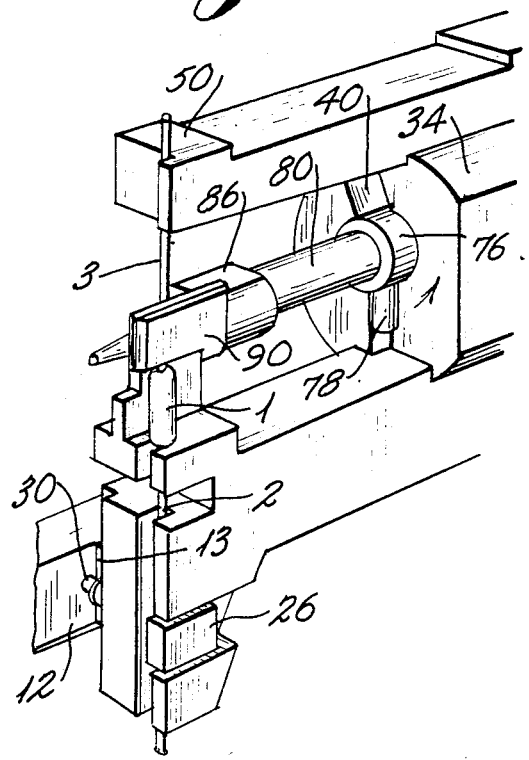
Figure 20:
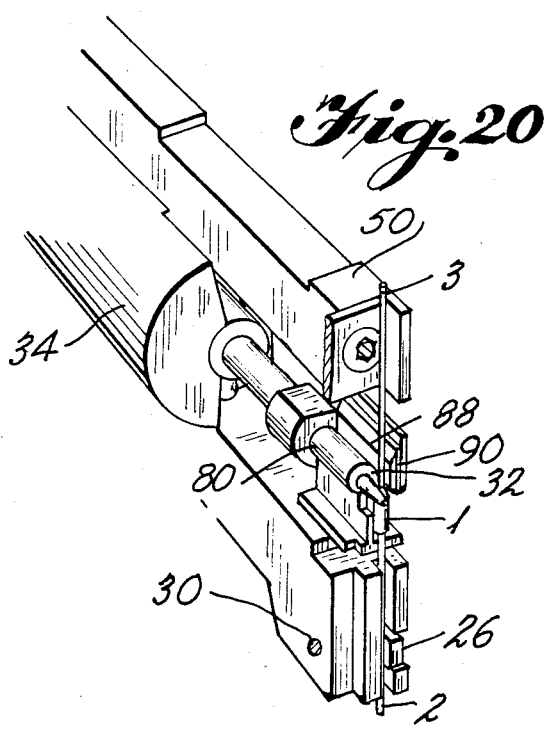
Figure 21:
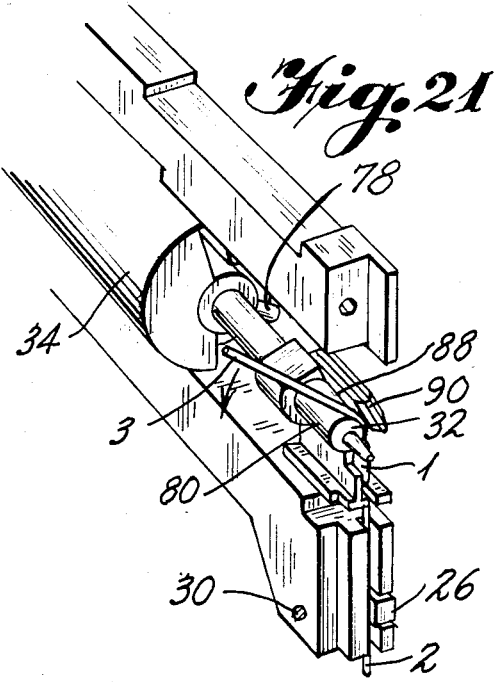

As seen in FIG. 18, component 1 has been trimmed from the taped end lead portions 9 and tooling assembly 24 is approaching the component during forward stroking of slide actuator cylinder 92. Cam bar 12 is fixed relative to housing 10 and is located such that clamp 26 will close upon the lower lead of component 1 at the appropriate point of travel during the stroking of slide 18. As seen in FIG. 19, with the component bottom lead gripped by clamp 26, rotary former 86 is in position to form the upper lead in the manner illustrated in FIGS. 20–23. As indicated earlier, rotation is imparted to rotary former 86 only after helix 84 has engaged the left end (as seen in FIG. 9) of slot 72. During this rotation of former 86, bending face 88 forces the upper lead to bend about tip 80, as seen in FIGS. 20–22, while arcuate guide 58 ensures that bent lead 3 and unbent lead 2 remain in a plane generally perpendicular to the direction of stroking of the apparatus. As seen in FIG. 23, offset forming portion 90 is cooperating with anvil portion 33 of clip loader 32 to impart a stand-off in lead 3, and relative longitudinal movement between rotational limiter 34 and rotary shaft 76 is about to occur since dog 78 and notch 42 are aligned. Accordingly, as forward stroking continues, tooling bracket 24 telescopes forward on tip 80 such that clip loader 32 starts to push formed lead 3 off of tip 80. When mounted on a circuit board, the component is stabilized relative to lead 2 by body 1 and corresponding clinched lead tip engaging opposite sides of the circuit board, and relative to lead 3 by the standoff and corresponding clinched lead tip engaging opposite sides of the circuit board.

Just prior to the leads of the formed component being gripped by the spring fingers of a conveyor clip 7, follower 30 of lead clamp 26 rides out of that portion of cam bar 12 which is between camming surfaces 11 and 13 to unclamp the lead. Thereafter, return stroking of actuator cylinder 92 causes retraction of the reciprocatable parts along with reverse rotation of rotatable shaft 76 in order that the device may index another component 1 forward and repeat the forming and loading functions.

Figure 11:
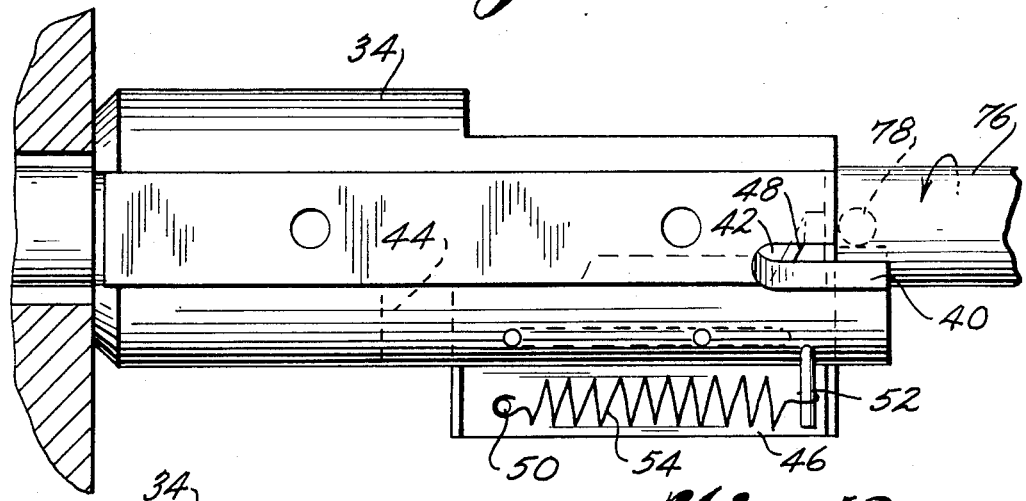
FIG. 11 is an enlarged elevation of a portion of the apparatus of the instant invention, as viewed generally in the direction of arrows 11—11 of FIG. 3.
Figure 12:
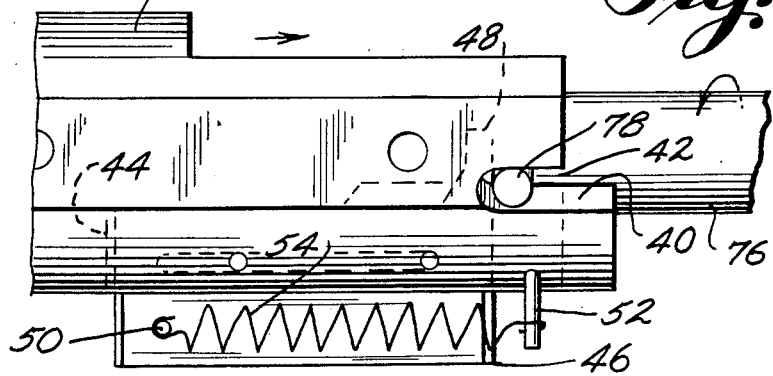
FIG. 12 is a view similar to that of FIG. 11, illustrating the component parts thereof in positions different from those of FIG. 11.

During the return stroke, a notch clearer 46 ensures that dog 78 clears notch 42 of rotation limiter 34, as seen in FIGS. 11 and 12. Notch clearer 46 rides in a slot 44 of rotation limiter 34 and is biased forward (to the right in FIGS. 11 and 12) by spring 54. An ear 48 of notch clearer 46 is always in engagement with dog 78 while it is in notch 42, as may be appreciated with reference to these figures. FIG. 12 shows the positioning of the device just after the clip loader 32 has engaged the leads of the component with the clip 7 and prior to the return stroke. Accordingly, spring biased notch clearer 46 clears dog 78 out of notch 42 during the return stroke to allow the reverse rotation of rotary former 76 via helix screw 82 and nut 84.

Figure 1:
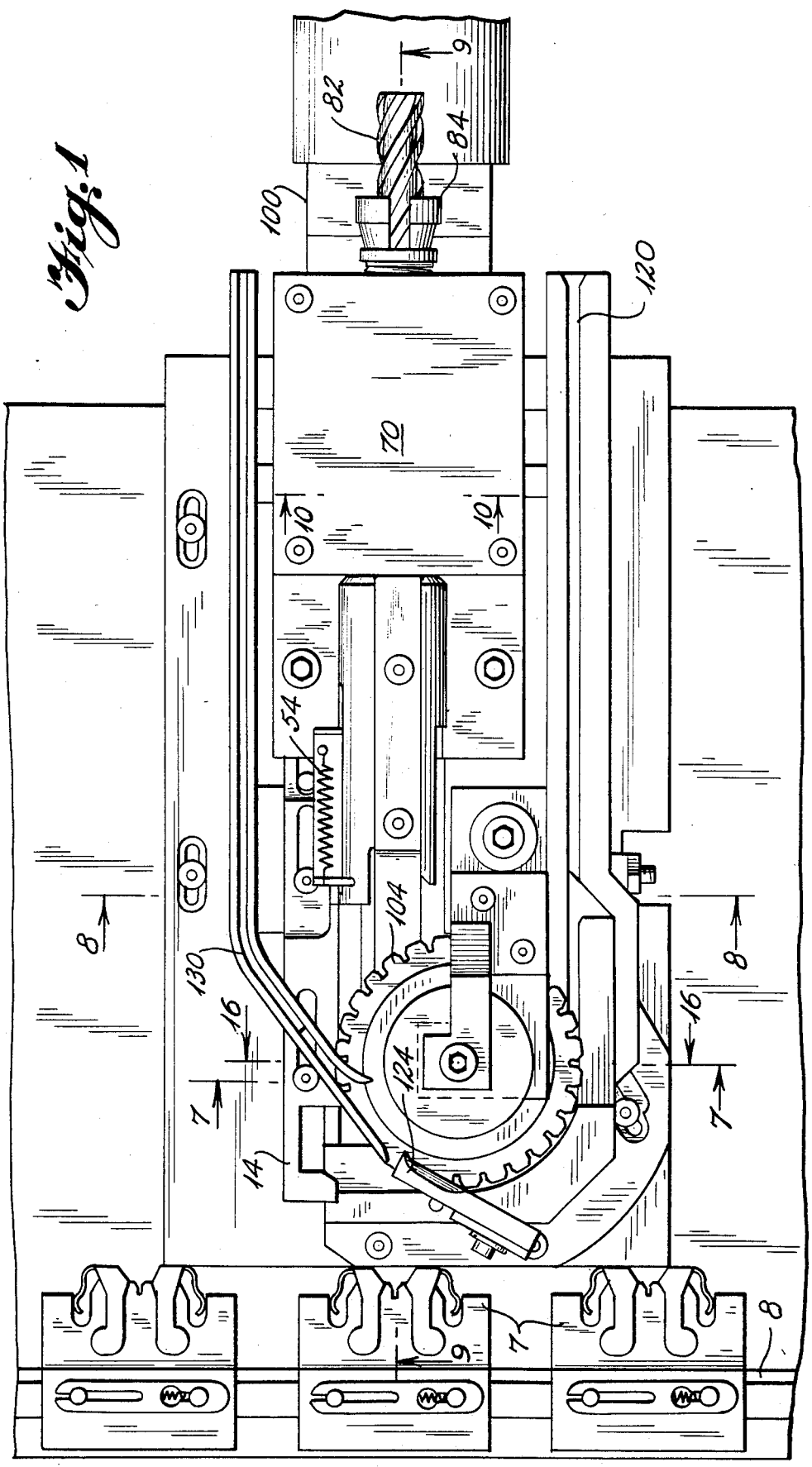
FIG. 1 is a top plan view of the device of the instant invention.
Figure 5B:
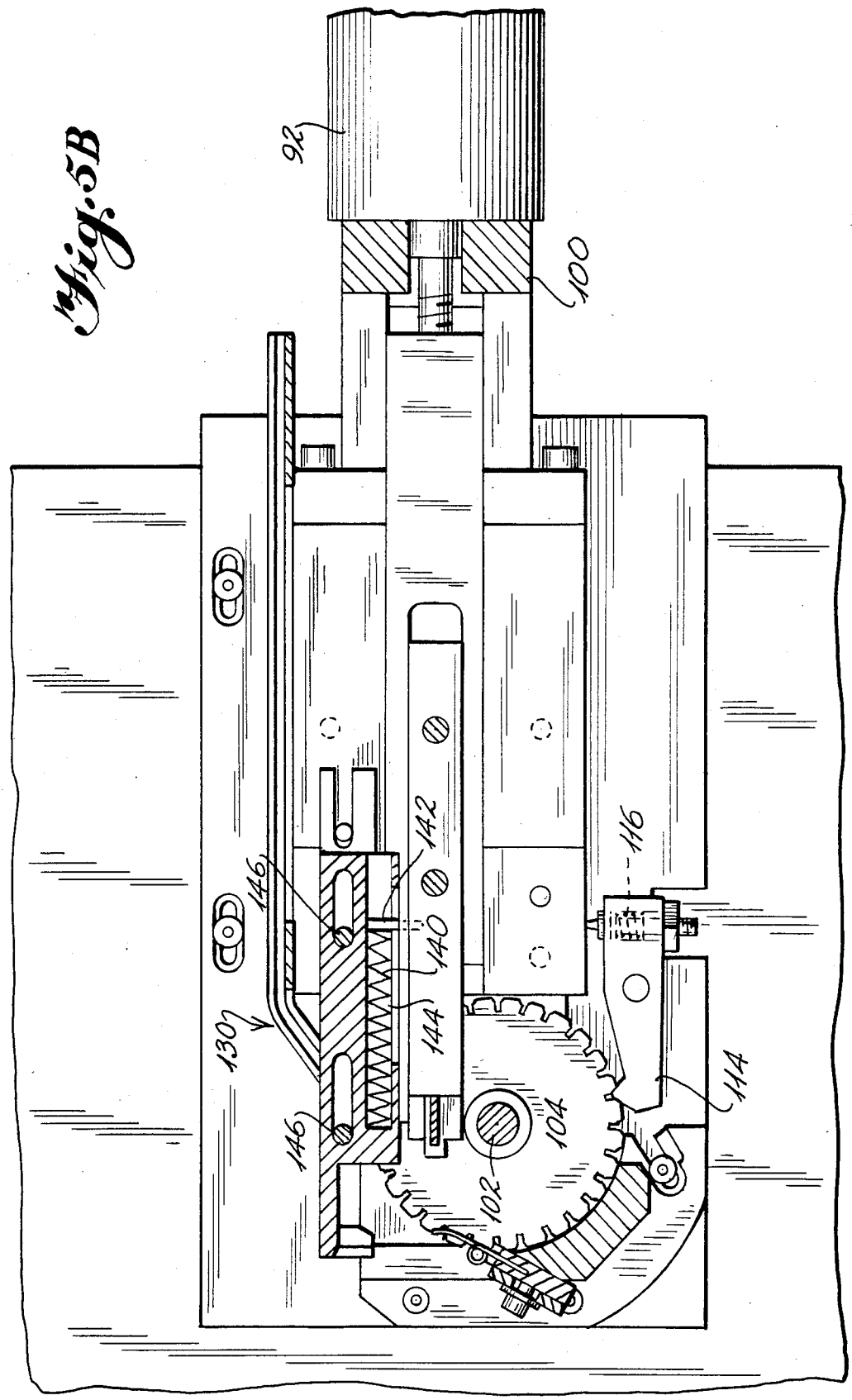
FIG. 5B is a cross-section as viewed generally in the direction of arrows 5B—5B of FIG. 2.
Figure 7:
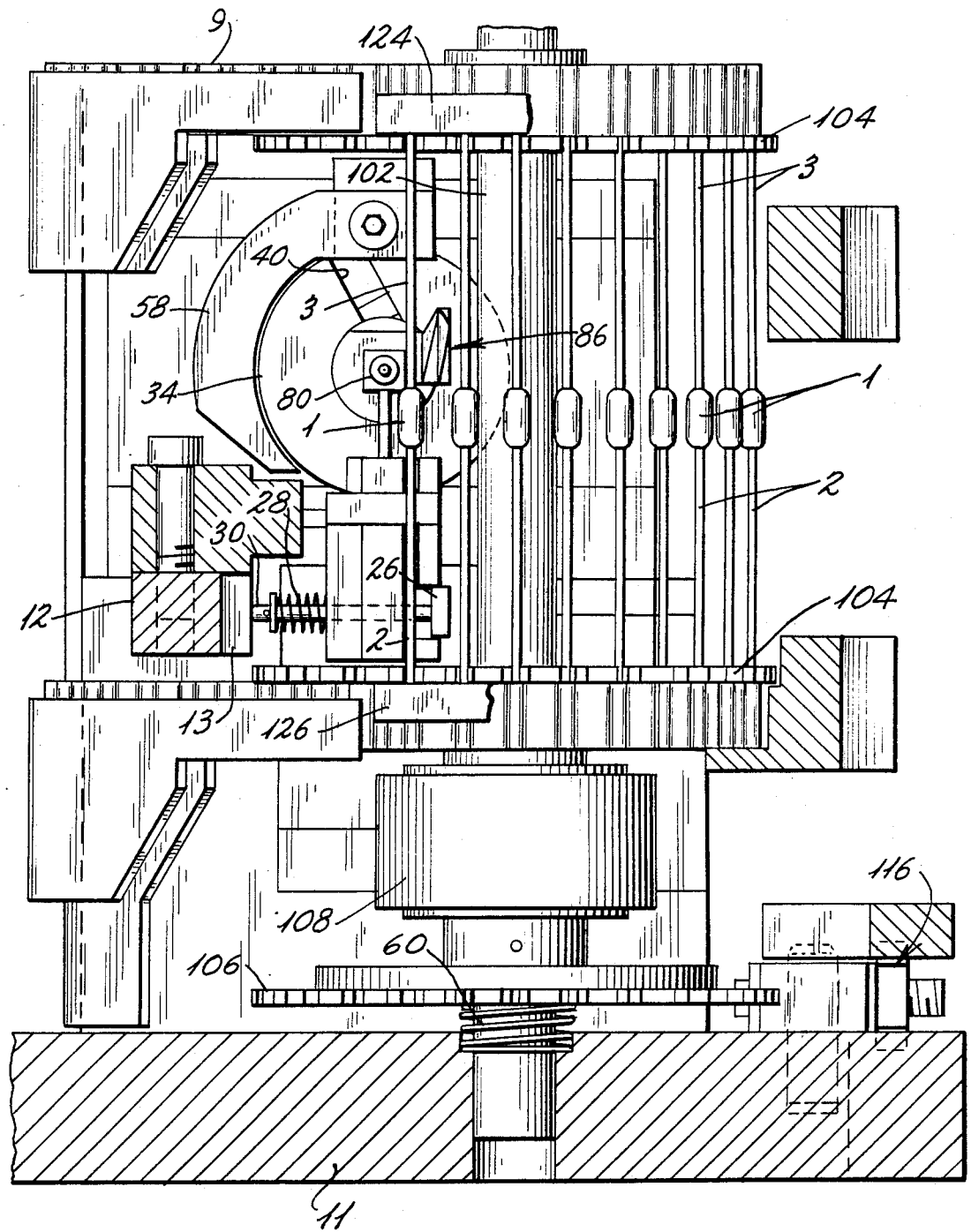
FIG. 7 is an enlarged front elevation, partially in section, as viewed generally in the direction of arrows 7—7 of FIG. 1.

The above cross-referenced U.S. Application Ser. No. 470,727 illustrates and describes the clips 7 and a typical system in which they would be used to convey components to other processing stations of the system. As described therein, clips 7 are spring biased in their attachment to conveyor 8 such that they are somewhat shiftable in the direction of the length of the conveyor 8 for proper positioning relative to the various stations of the system. Accordingly, a clip centering device 14 has been provided in the instant invention to assure proper loading of clip 7. As seen in FIGS. 7 and 8, clip centerer 14 is slidably mounted to the top of camming bar 12 via slots 145 and bolts 146. Clip centerer 14 has a spring 140 riding in a channel thereof with a pin 142 of reciprocating tooling bracket 24 in engagement with spring 140 via a slot 144 as seen in FIG. 5B. Accordingly, clip centerer 14 rides forward so that the chamfered portions 147 (as seen in FIGS. 5B and 9) will engage portion 7' (FIG. 1) of clip 7 to properly center clip 7 relative to a central working axis of the device of the invention. During the forward stroke, clip centerer 14 is driven forward via pin 142 and spring 140, with return of centerer 14 provided by engagement of pin 142 with the rear of slot 144 during the return stroke.

It will thus be seen that the objects set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described, what is claimed as new and desired to be secured as Letters Patent Is:

1. An apparatus for processing electronic components, each component having a body and at least two generally coaxial leads protruding in opposite directions from said body and comprising:
   means for indexing each of said components, in sequence, to a forming area;
   means for severing end portions of said two leads of each said component during said indexing in order to effect removal of said component from a series of said components connected in said series via taping together of corresponding end portions of each component;
   means for positively gripping and constraining a first of said leads without bending said first lead;
   means for bending a second, oppositely protruding lead during gripping and constraining of said first lead such that said leads point in generally the same direction and define a plane;
   means for forming a stand-off in said second lead to complete a formed component during said gripping and constraining of said first lead; and
   means for transferring said formed component into positive engagement with a clip means for carrying said formed component to subsequent processing.

2. An apparatus as in claim 1, wherein said indexing means comprises:
   spaced, coaxial feed wheels each having peripheral notches in which said coaxial leads are receivable; and
   means for stepped rotating of said wheels and advancing said taped series of components via engagement of said notches and leads.

3. An apparatus as in claim 2, wherein said severing means comprises:
   a blade cooperating with each of said feed wheels and positioned relative to said wheel notches such that each of said leads is forced by said blade radially inwardly in a corresponding wheel notch to effect shearing of sequentially presented leads upon continued rotation of said wheel.

4. An apparatus as in claim 3, and further comprising:
   spring means for retaining a remaining portion of each lead in contact with said wheel notch after said severing.

5. An apparatus as in claim 1, and further comprising:
   a housing; and
   a slide reciprocatable with a forward stroke and a return stroke relative to said housing, said slide comprising a cam cooperating with a one-way clutch of said indexing means such that said indexing occurs during said forward stroke.

6. An apparatus as in claim 5, and further comprising:
- a tooling assembly attached to said slide for movement therewith during said forward and return strokes, said gripping and transferring means attached to said tooling assembly and actuatable in concert with said forward and return strokes; and
- a rotary shaft telescopic relative to said tooling assembly and means for rotating said shaft in opposite directions during said forward and reverse strokes, respectively, said rotary shaft supporting said bending means such that said bending is effected during said forward stroke.

7. An apparatus as in claim 6, wherein said shaft rotating means comprises:
- a helix screw attached to said rotary shaft and a cooperating helix nut slidably attached to said housing so as to effect said rotation during relative motion between said helix screw and nut; and
- means for limiting rotation of said shaft and for shifting said shaft during a portion of said forward and reverse strokes to effect said relative motion between said helix screw and nut.

8. An apparatus as in claim 6, wherein said forming means comprises:
- a portion of said bending means cooperatable with a portion of said tooling assembly upon completion of said bending and during said transferring.

* * * * *